United States Patent [19]

Hansen et al.

[11] Patent Number: 5,055,806
[45] Date of Patent: Oct. 8, 1991

[54] REFLECTION-FREE TERMINATION OF A TEM WAVEGUIDE

[75] Inventors: Diethard Hansen, Berikon; Dietrich Königstein, Gebenstorf, both of Switzerland

[73] Assignee: Asea Brown Boveri Ltd., Baden, Switzerland

[21] Appl. No.: 409,789

[22] Filed: Sep. 20, 1989

[30] Foreign Application Priority Data

Oct. 14, 1988 [CH] Switzerland .................. 3853/88

[51] Int. Cl.$^5$ .................................. H01P 1/26
[52] U.S. Cl. ......................... 333/22 R; 342/1; 338/333
[58] Field of Search ............ 333/22 R, 81 A; 343/703; 342/1, 4

[56] References Cited

U.S. PATENT DOCUMENTS

| | | |
|---|---|---|
| 3,354,412 | 11/1967 | Steidlitz . |
| 4,260,962 | 4/1981 | Dydyk .................. 333/22 R |
| 4,267,531 | 5/1981 | Spinner et al. ............ 333/22 R |
| 4,413,241 | 11/1983 | Bitoune ................. 333/22 R |
| 4,605,916 | 8/1986 | Tehori . |

FOREIGN PATENT DOCUMENTS

| | | |
|---|---|---|
| 0044758 | 1/1982 | European Pat. Off. . |
| 0246544 | 11/1987 | European Pat. Off. . |
| 3130487 | 2/1983 | Fed. Rep. of Germany . |
| 3503181 | 8/1986 | Fed. Rep. of Germany . |
| 2360969 | 3/1978 | France . |

*Primary Examiner*—Paul Gensler
*Attorney, Agent, or Firm*—Oblon, Spivak, McClelland, Maier & Neustadt

[57] ABSTRACT

A reflection-free termination of a TEM waveguide, in which a TEM wave is conducted through an inner conductor (4) and an outer conductor (1) and is absorbed at one end of the TEM waveguide by an RF absorber (5) for absorbing a field energy and by an ohmic line termination (7) for absorbing a conductor-guided energy of the TEM wave, is constructed in such a manner that the line termination (7) is located in a plane determined by the inner conductor (4) and located in the wave direction. The line termination (7) is constructed as an ohmic resistance which produces a gradual, serial damping on the inner conductor (4) and locally compensates for a capacitance loading additionally produced at the line termination (7) by the RF absorbers.

10 Claims, 3 Drawing Sheets

REFLECTION-FREE TERMINATION OF A TEM WAVEGUIDE

BACKGROUND OF THE INVENTION

1. Field of the Invention

The invention relates to a reflection-free termination of a TEM waveguide, in which a TEM wave is conducted through an inner conductor and an outer conductor and is absorbed at one end of the TEM waveguide by an RF absorber for absorbing the field energy and by an ohmic line termination for absorbing the conductor-guided energy of the TEM wave.

2. Discussion of Background

A device for EMI testing electronic equipment is known from Swiss Patent Application CH-2026/86-9. Compared with other test equipment, it exhibits great advantages in EMI testing (EMI=electromagnetic interference) electronic equipment. In particular, it creates a defined field distribution over a wide frequency range and can also be used for wide-band emission measuring.

However, it has been found that unwanted local and frequency-dependent inhomogeneities occur in the wave field. This is associated with the fact that the line termination is not sufficiently free of reflections.

A line termination for TEM waveguides is known, for example, from Offenlegungsschrift (German Patent) DE-31 30 487 Al. In particular, the inner conductor is there provided with terminating resistors which are located on equipotential lines, that is to say across the direction of propagation of the wave field. Measurements with such arrangements have shown, however, that these are not suitable for frequencies above 100 MHz.

A prior art TEM waveguide is illustrated in FIG. 7. The TEM waveguide opens out in a pyramid shape from its tip 2 at which a coaxial feeding bush is provided (not shown) via which a pulse or sinusoidal generator 14 may be connected to the TEM waveguide by means of coaxial cable 3. The TEM waveguide exhibits a closed outer line 1 having a rectangular cross-section. A plate-shaped inner line 4 of triangular shape is asymmetrically disposed in the waveguide, that is, the spacing from the top of outer line 1 to inner line 4 is smaller than the spacing from the bottom of outer line 1 to inner line 4. The TEM waveguide is closed on one end by a plurality of mutually adjoining pyramid-shaped highfrequency peak absorbers 6 which form absorber wall 5. Disposed in absorber wall 5 are terminal resistors 8.1, 8.2 and 8.3 which are used to terminate inner line 4 at contour point 4.1, 4.2 and 4.3, respectively. The absorber wall 5 is curved in the shape of a spherical segment. The center of curvature is situated in the region of the tip 2 of the TEM waveguide.

Also shown in FIG. 7 are measuring instruments 11 connected via cable 12 to system 13. System 13 is placed in the waveguide for testing the effect of electromagnetic fields on this system. It is apparent to one of ordinary skill in the art that the TEM waveguide may be of varying sized commensurate with the volume needed to appropriately test inserted system 13.

SUMMARY OF THE INVENTION

Accordingly, the object of this invention is to provide a novel reflection-free termination of a TEM waveguide of the type initially mentioned.

According to the invention, the solution consists in the fact that in such a line termination for TEM waveguides a) the line termination is located in a plane determined by the inner conductor and located in the wave direction,
b) the line termination is constructed as an ohmic resistance which produces a gradual, serial damping on the inner conductor and
c) locally compensates for a capacitance loading additionally produced at the line termination by the RF absorbers.

The field energy is absorbed in an absorber area arranged in parallel with the ohmic termination.

The line termination preferably at the same time exhibits a resistance contour which matches the current distribution across the direction of propagation of the TEM wave.

It is particularly advantageous to use the line termination according to the invention in a device for EMI testing electronic equipment, the device comprising a pyramidally expanding TEM waveguide which is terminated by a field-matching spherical-cap-shaped RF absorber with RF point absorbers.

This enables the electronic equipment to be not only reliably tested for irradiation but also their emission to be accurately measured.

Further advantageous embodiments of the invention are found in the dependent claims.

BRIEF DESCRIPTION OF THE DRAWINGS

In the text which follows, the invention will be explained in greater detail with reference to illustrative embodiments and in conjunction with the drawing, in which.

DESCRIPTION OF THE PREFERRED EMBODIMENTS

Figure 1:
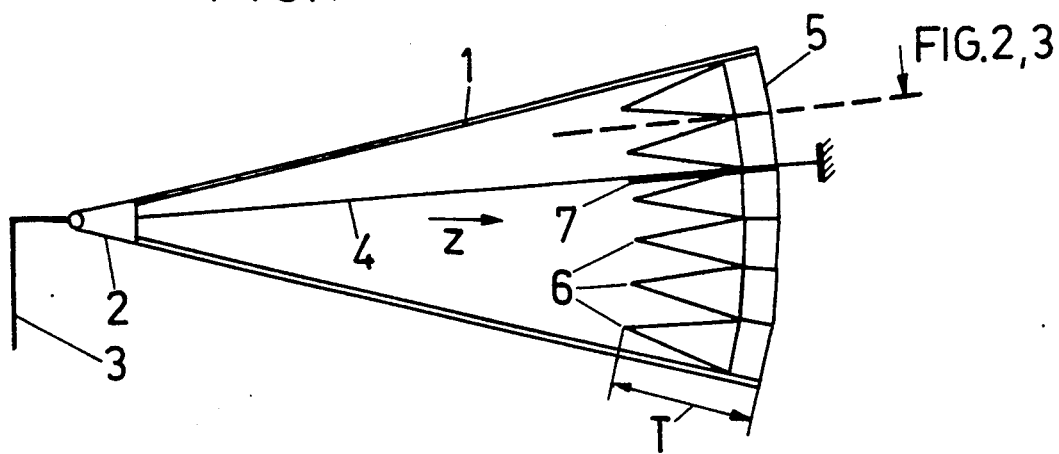
FIG. 1 shows a device for EMI testing electronic equipment.

FIG. 1 shows the essential parts of a device for EMI testing electronic equipment. It comprises a TEM waveguide with an outer conductor 1, an unbalanced inner conductor 4, a feeder wedge 2 and an RF absorber 5. A coaxial cable 3 supplies, for example, a pulse-shaped or sinusoidal radio frequency (RF) to the feeder wedge 2 which generates a TEM wave (TEM=transverse electromagnetic) and couples it into the TEM waveguide.

The TEM waveguide expands pyramidally from a point. The RF absorber 5 is located at the expanded end of the TEM waveguide and has the shape of a spherical cap. It is provided with RF point absorbers 6 and matched to the required wave field propagating in the TEM waveguide. That is to say, it absorbs the field proportion of the energy of the TEM wave.

The TEM waveguide as such is described in detail in Swiss Patent Application CH-2026/86-9 the content of which is herewith included in the present application.

The inner conductor 4 is plate-shaped and is provided with a line termination 7 at the wide end of the TEM waveguide 1. According to the invention, this line termination 7 is constructed in such a manner that the conductor-guided proportion of the energy of the TEM wave is absorbed. This line termination cannot produce any interference and, at the same time, interference modes produced for other reasons are attenuated. In the text which follows, the essential points to be noted in order to obtain the desired effects are discussed.

Firstly, the line termination 7 must be geometrically arranged in such a manner that it is located in a plane determined by the inner conductor 4. It thus represents a level continuation of the inner conductor 4 in the direction of the wave field. (An arrow designated by z indicates the direction of the wave field in FIG. 1.) Thus, a current flowing in the inner conductor 4 is removed without discontinuity. Due to the fact that the current propagation in the wave direction is not disturbed, no unwanted modes are produced.

Secondly, the line termination 7 must be constructed as an ohmic resistance which produces a gradual serial damping on the inner conductor 4. This will be explained with reference to FIGS. 2 and 3.

Figure 2:
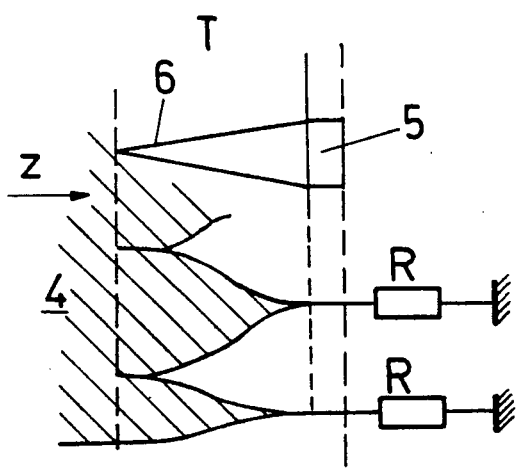
FIG. 2 shows a line termination according to the prior art.
Figure 3:
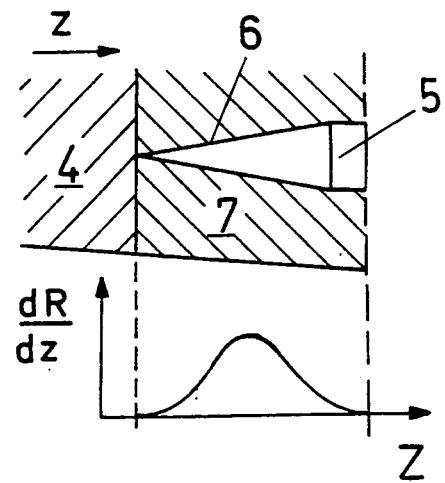
FIG. 3 shows a line termination according to the invention.

FIG. 2 shows how the inner conductor 4 is terminated in the prior art. (FIGS. 2 and 3 shows a top view of the area of the inner conductor 4.) The wave field generated is attenuated in an end region T which is given by the thickness of the RF absorber 5. In this end region, the inner conductor 4 is contoured in the form of teeth and ends at the point where the RF point absorbers 6 abut one another. The tooth points are passed through the coherent part of the RF absorber 5 by means of a wire and are terminated with an ohmic resistance R behind it.

FIG. 3 shows how the line termination 7 according to the invention terminates the inner conductor 4. The RF absorber 5 and an RF point absorber 6 are indicated as in FIG. 2. The line termination 7 covers the entire end region T (See FIG. 1). It thus also passes through the coherent part of the RF absorber 5. It is constructed as an area and has a resistance contour $dR/dz$, in the direction of propagation of the wave field, which locally compensates for the capacitance loading additionally produced at the line termination 7 by the RF absorber 5. The TEM wave thus "sees" the locally matched characteristic impedance at any point.

In the general case, the resistance contour $dR/dz$ rises from a small value at the inner conductor/line termination transition to the maximum and then falls again to a small value towards the end of the end region.

According to a preferred embodiment of the invention, the line termination exhibits at the same time a resistance contour which matches the current distribution across the direction of propagation of the TEM wave. This prevents the large current components at the lateral edge of the inner conductor from being dispersed across the direction of propagation of the TEM wave. Correspondingly, the resistance contour decreases across the direction of the wave field, that is to say from the center of the line termination towards the sides. Seen quantitatively, the resistance contour will thus have the smallest values at the edges of the line termination.

Finally, the line termination 7 is constructed in such a manner that a capacitance loading additionally produced at the inner conductor 4 by the RF absorber 5 and the RF point absorber 6 is locally compensated.

Figure 5:
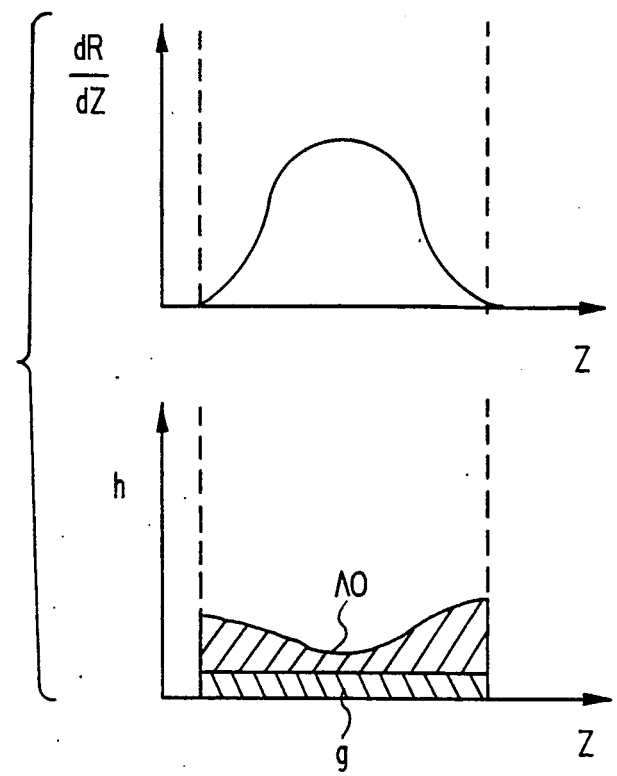
FIG. 5 shows a support plate provided with a resistance layer according to the invention.

The line termination 7 according to the invention can be preferably implemented in such a manner that a support plate 9, for example a plywood plate, is provided with a resistance layer 10, for example graphite coating with suitable location-dependent thickness, as illustrated in FIG. 5. So that the current is conducted preferably without interference from the inner conductor 4 to the resistance coating, a metallic tooth-shaped transition region can be provided on the support plate.

Figure 4:
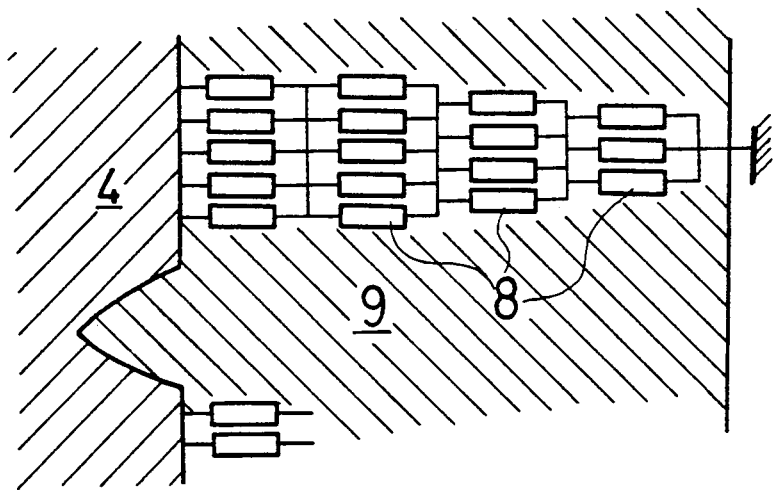
FIG. 4 shows a line termination in the form of a discrete resistance network.

FIG. 4 shows a further embodiment. In this embodiment, the ohmic serial damping on the line termination is implemented by means of a network of discrete resistors 8.

A fiber-reinforced plastic plate is suitable as support plate 9. It is covered with a suitable resistance layer or is itself used directly as resistance, depending on material.

Figure 6:
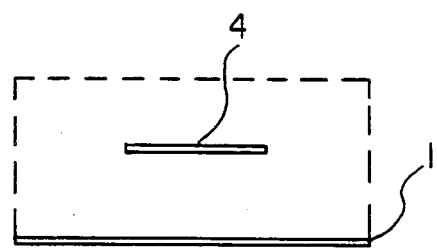
FIG. 6 shows a sectional view of an open waveguide according to the invention.
Figure 7:
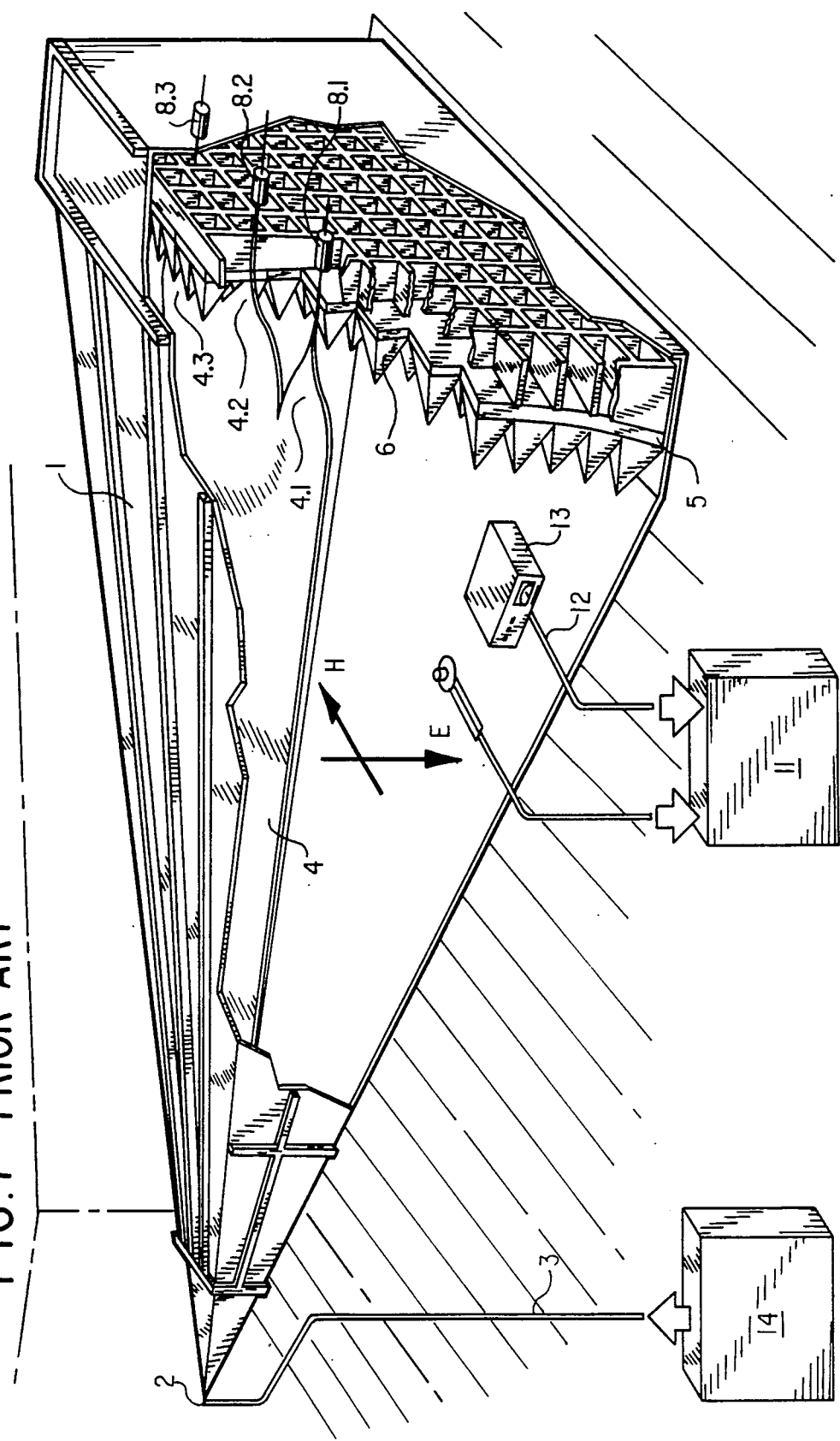
FIG. 7 shows a perspective view of a waveguide according to the prior art.

However, the invention is not restricted to the illustrative embodiments described. In particular, it is also suitable for open or half-open TEM waveguides in which therefore the outer conductor is open at one or several ends. In FIG. 6, a section of a TEM waveguide perpendicular to the z axis is shown, with the dashed lines representing a removed face of the outer conductor used in a closed TEM waveguide.

In the text which follows, further characteristics and advantages of the invention are listed as keywords:

1. The invention creates a distinct increase in quality with respect to the field homogeneity in the entire test volume and frequency range.
2. It is thus possible to construct much larger high-quality test chambers (for example for systems and vehicles).
3. The production costs of the terminating area of wide-band cells are lowered.
4. Compared with the discrete resistors in the prior art, the cooling of the terminating resistance distributed over an area is better and more simple. Correspondingly, the test chambers can be used for higher operating field strengths. Similarly, a greater constructional height is made possible by this.
5. The high-voltage strength becomes greater.
6. Due to the high field quality, a precise correlation with the standardized free-field emission values is possible.
7. The invention can also be used for terminating open waveguide arrangements.
8. Finally, wide-band, high-power and high-voltageresistant terminating loads (so-called dummy loads) can be constructed in accordance with the invention.

It can be said in conclusion that the invention creates a wide-band reflection-free line termination which can be used with great advantage wherever high power has to be dissipated.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A reflection free TEM waveguide, through which a TEM wave is conducted, comprising:
   an inner conductor;
   an outer conductor;
   an RF absorber disposed at one end of the TEM waveguide for absorbing an electromagnetic field energy of said TEM wave; and
   line termination means for producing a gradual damping on the inner conductor in a direction of propagation of said TEM wave and for locally compensating for a capacitance loading additionally produced at the line termination by the RF absorber, said means being located in a planar extension of the inner conductor in the propagation direction, covering an entire region of intersection of said extension with the RF absorber, exhibiting an ohmic resistance, and absorbing the conductor-guided energy of the TEM wave.

2. A reflection-free TEM waveguide as claimed in claim 1, wherein the TEM waveguide is a closed TEM waveguide.

3. A reflection-free TEM waveguide as claimed in claim 1, wherein the TEM waveguide is an open TEM waveguide.

4. A reflection-free TEM waveguide as claimed in claim 1, wherein the line termination comprises a support plate with a resistance layer.

5. A reflection-free TEM waveguide as claimed in claim 1, wherein the line termination comprises a network of discrete resistors.

6. A reflection-free TEM waveguide as claimed in claim 4, wherein the resistance layer consists of graphite and exhibits a location-dependent thickness.

7. A reflection-free TEM waveguide as claimed in claim 4, wherein the support plate is a fiber-reinforced plastic plate.

8. A reflection-free TEM waveguide as claimed in claim 1, wherein the line termination is formed by a fiber-reinforced plastic plate.

9. A reflection-free TEM waveguide as claimed in claim 1, wherein the line termination, at the same time, exhibits a resistance contour which matches a current distribution across the direction of propagation of the TEM wave.

10. A device for EMI testing electronic equipment, comprising:
    a pyramidally expanding TEM waveguide terminated by a field-matched spherical-cap-shaped RF absorber with RF point absorbers; and
    a plate-shaped inner conductor disposed in said TEM waveguide having a line termination;
    said line termination including line termination means for producing a gradual damping on the inner conductor in a direction of propagation of a TEM wave in the TEM waveguide and for locally compensating for a capacitance loading additionally produced at the line termination by the RF absorber, said means being located in a planar extension of the inner conductor in the propagation direction, covering an entire region of intersection between the extension and the RF absorber and exhibiting an ohmic resistance.

* * * * *